US011936356B2

United States Patent
Wen (10) Patent No.: US 11,936,356 B2
(45) Date of Patent: Mar. 19, 2024

(54) IMPEDANCE MATCHING CIRCUIT AND METHOD

(71) Applicant: Taiwan Semiconductor Manufacturing Company, Ltd., Hsinchu (TW)

(72) Inventor: Chin-Hua Wen, Toufen Township (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/742,803

(22) Filed: May 12, 2022

(65) Prior Publication Data
US 2023/0370050 A1 Nov. 16, 2023

(51) Int. Cl.
*H03H 11/28* (2006.01)

(52) U.S. Cl.
CPC .................... *H03H 11/28* (2013.01)

(58) Field of Classification Search
CPC ....... H03K 19/018557; H03K 19/0005; H03H 11/28
See application file for complete search history.

(56) References Cited

U.S. PATENT DOCUMENTS

| 2008/0100333 A1* | 5/2008 | Kim ............... H03K 19/0005 326/30 |
| 2008/0211533 A1 | 9/2008 | Kim et al. |
| 2009/0261856 A1 | 10/2009 | Kwean |
| 2017/0366183 A1* | 12/2017 | Jung ............... G11C 11/4085 |

FOREIGN PATENT DOCUMENTS

CN        101256826 B       3/2013

OTHER PUBLICATIONS

Taiwan Office Action for Application No. 111149015 dated Nov. 23, 2023.

* cited by examiner

*Primary Examiner* — Patrick C Chen
(74) *Attorney, Agent, or Firm* — Merchant & Gould P.C.

(57) ABSTRACT

An impedance matching circuit is provided. The impedance matching circuit includes a reference voltage generator configured to generate a reference voltage. A code generator is configured to generate a first calibration code by comparing the reference voltage with a first voltage associated with a first node and a second calibration code by comparing the reference voltage with a second voltage associated with a second node. A first resistance unit is configured to supply the first voltage to the first node in response to the first calibration code to calibrate its resistance to be equal to a reference resistance. A second resistance unit is configured to supply the second voltage to the second node in response to the second calibration code to thereby calibrate its resistance to the reference resistance.

20 Claims, 6 Drawing Sheets

IMPEDANCE MATCHING CIRCUIT AND METHOD

BACKGROUND

A variety of semiconductor devices embodied by an integrated circuit chip, such as a Central Processing Unit (CPU), a memory and a gate array, have been combine in electrical products such as a personal computer, a server, and a work station. In most cases, the semiconductor devices with a receiving circuit for receiving signals from the outside through input pads and an output circuit for providing internal signals to the outside through output pads.

The input/output pads are connected to a transmission path. Electrical signals are reflected back when the impedance differs. The impedance mismatching is caused by variation of a manufacture process, a supply voltage and an operation temperature (PVT). The impedance mismatching makes it hard to transmit data at high speed the signals are distorted by the impedance mismatching.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to reduce the impact of environmental variation, an impedance matching circuit is described. The disclosed impedance matching circuit can be embedded in a semiconductor device, for example, a memory device or a processing device. By embedding the impedance matching circuit, the performance of input/output interfaces of the semiconductor device will be independent of a Process, Voltage, and Temperature (PVT) variation. In examples, the disclosed impedance matching circuit uses only one comparator which leads to decreased power consumption and increased accuracy.

Figure 1:
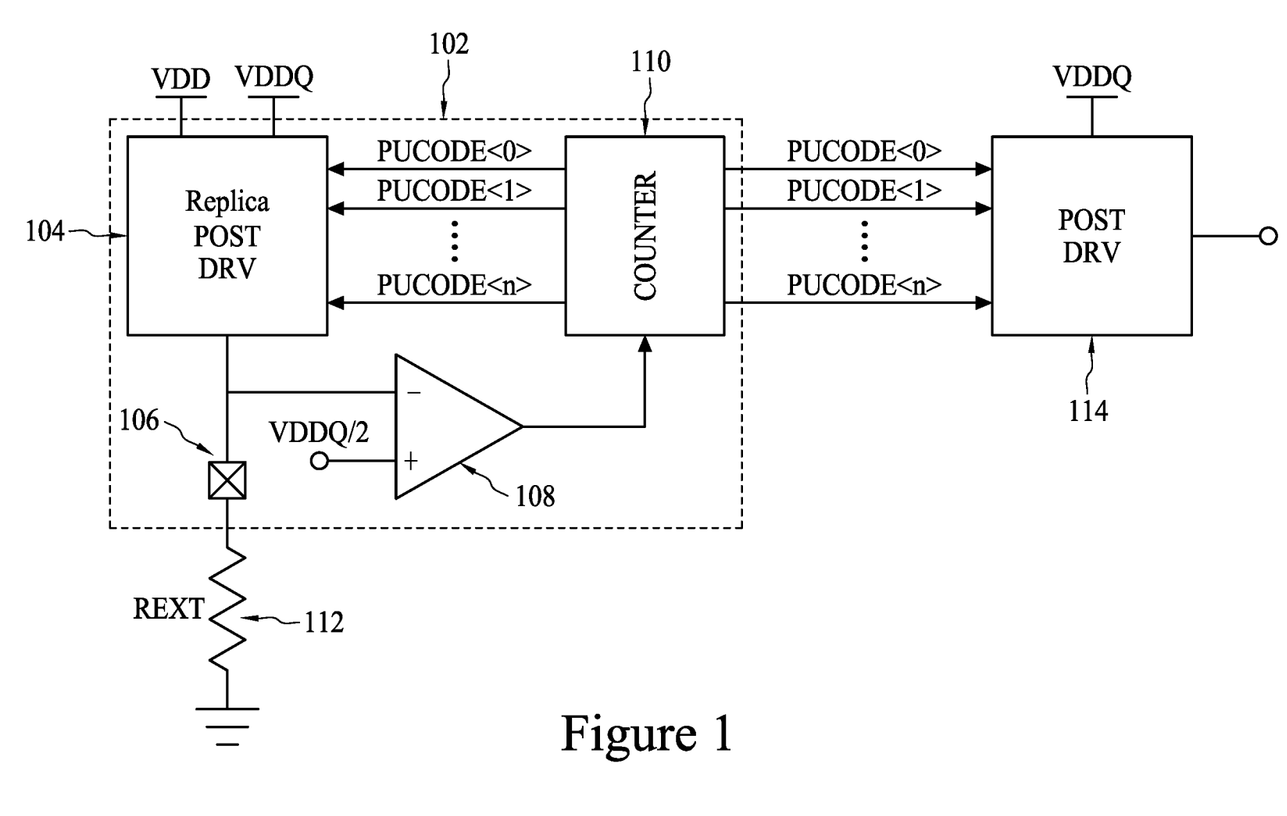
FIG. 1 is a block diagram showing an impedance matching circuit in accordance with some embodiments.

FIG. 1 is a block diagram showing an impedance matching circuit 100 in accordance with some embodiments. As shown in FIG. 1, impedance matching circuit 100 includes a PVT calibration circuit 102. PVT calibration circuit 102 includes a replica post driver 104 (also referred to as a replica resistance unit), a pad 106 (also referred to as a first node), a comparator 108, and a counter 110. Impedance matching circuit 100 further includes an external resistor 112 (also referred to as a reference resistor) and a post driver 114 (also referred to as resistance unit).

Replica post driver 104 is connected to pad 106. A first terminal of external resistor 112 is connected to pad 106 and a second terminal of external resistor 112 is connected to the ground. A first input terminal of comparator 108 is connected to pad 106 and a second input terminal of comparator 108 is connected to a reference voltage node which provides a reference voltage. An output terminal of comparator 108 is connected to a counter 110. Power for post driver 114 is provided from a voltage VDDQ. Power for replica post driver 104 is provided through a supply voltage VDD and the voltage VDDQ. In examples, the supply voltage is approximately equal to 150 mV and the voltage VDDQ is approximately equal to 300 mV. However, other voltages are possible. In addition, the reference voltage is approximately equal to one half of the voltage VDDQ (that is, 150 mV). Moreover, in examples, a resistance value of external resistor 112 is 50 ohms. However, other resistance values are possible.

For PVT calibration, comparator 108 compares a pad voltage (also referred to as a first voltage) received at the first input terminal with the reference voltage received at the second input terminal and provides an output signal based on the comparison on the output terminal. The output signal of comparator includes an UP/DOWN signal. Counter 110 receives the UP/DOWN signal from the output terminal of comparator 108 and generates a binary code, also referred to as a PUCODE<0:N> (for example, PUCODE<0>, PUCODE<0>, . . . , PUCODE<n>). The PUCODE<0:N>, also referred to as calibration codes, is provided to both replica post driver 104 and post driver 114. PUCODE<0:N> is used to calibrate a resistance value of replica post driver 104 to match that of external resistor 112. For example, the PUCODE<0:N> is used to turn ON or turn OFF one or more transistors in replica post driver 104 to calibrate a resistance value of replica post driver 104 to match that of external resistor 113. Similarly, the PUCODE<0:N> is used to calibrate a resistance value of post driver 114 to match that of external resistor 112. For examples, the PUCODE<0:N> is used to turn ON or turn OFF one or more transistors in post driver 114 to calibrate a resistance value of post driver 114 to match that of external resistor 112.

Figure 2:
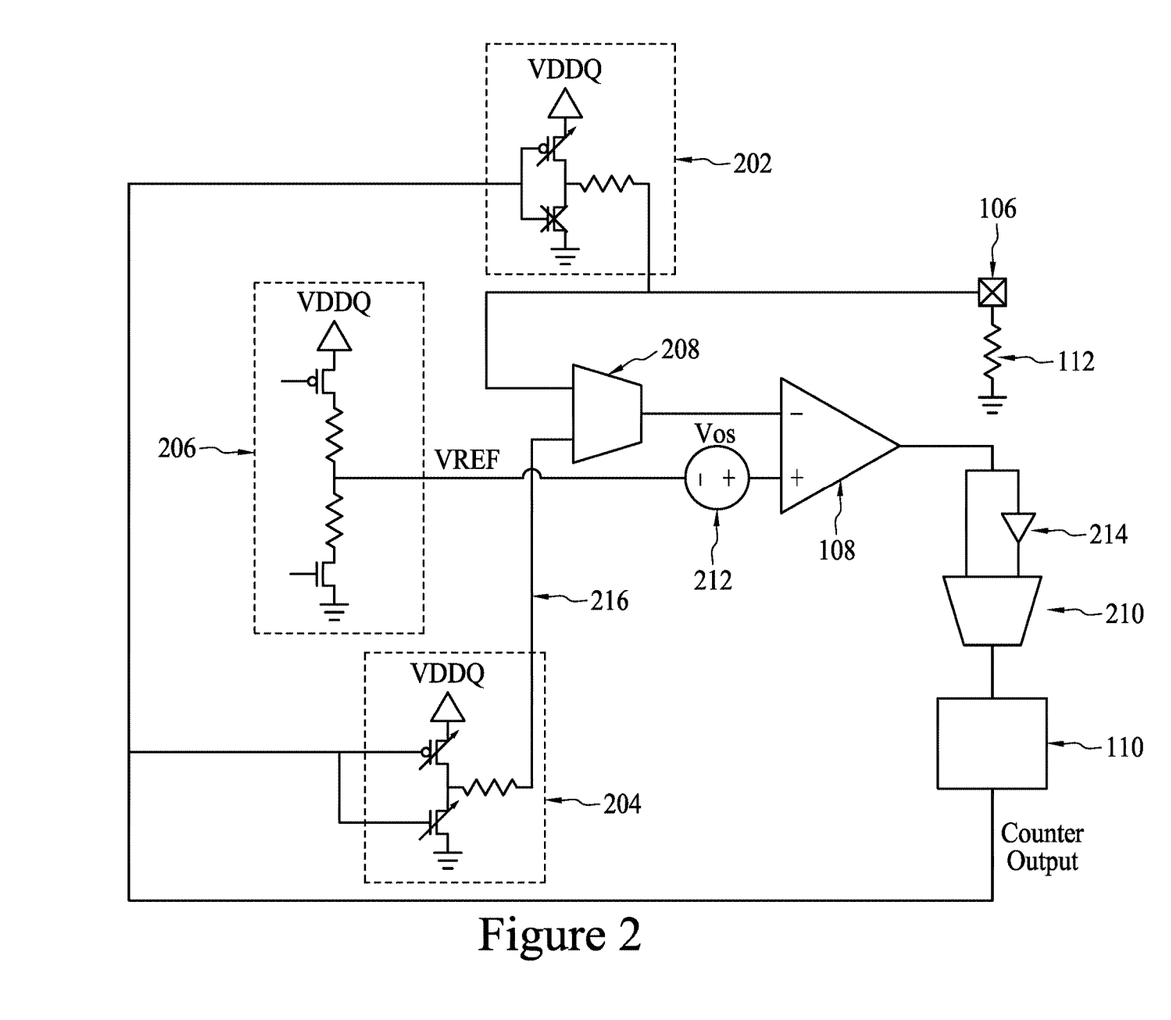
FIG. 2 is a block diagram showing a Process, Voltage and Temperature (PVT) calibration circuit, in accordance with some embodiments.

FIG. 2 is block diagram showing PVT calibration circuit 102 in accordance with some embodiments. As shown in FIG. 2, PVT calibration circuit 102 includes a first post driver 202 and a second post driver 204. First post driver 202 is also referred to as a pull-up post driver or a first resistance unit and second post driver 204 is also referred to as a pull-down post driver or a second resistance unit. In some examples, each of first post driver 202 and second post driver 204 include a plurality of resistors and a plurality of transistors. Each of the plurality of resistors of first post driver 202 are connected to one of the plurality of transistors at a first internal node in series. In addition, each of the plurality of resistors of first post driver 202 are connected in parallel to each other. Similarly, each of the plurality of resistors of second post driver 204 are connected to one of the plurality of transistors at a second internal node in series. In addition, each of the plurality of resistors of second post driver 204 are connected in parallel to each other.

PVT calibration circuit 102 further includes a reference voltage generator 206, a first data selector 208 (also referred to as a first multiplexer 208), a second data selector 210 (also referred to as a second multiplexer 210), an offset voltage 212, and an invertor 214. In addition, PVT calibration circuit 102 includes comparator 108 and counter 110. In examples, both first multiplexer 208 and second multiplexer 210 are 2:1 multiplexers. In examples, comparator 108 is an operation amplifier. In some examples, reference voltage generator 206 includes a plurality of resistors connected in series between a voltage VDDQ node and the ground. In examples, first multiplexer 208, comparator 108, second multiplexer 210, invertor 214, and counter 110 form a code generator circuit.

As shown in FIG. 2, first post driver 202 is connected between a voltage VDDQ node and pad 106. External resistor 112 is connected between pad 106 and the ground. A first input terminal of first multiplexer 208 is connected to pad 106. A second input terminal of first multiplexer 208 is connected to second post driver 204 at a second node 216. Thus, second post driver 204 is connected between a second node 216 and the ground. In examples, first post driver 202 provides a first voltage at pad 106 and second post driver 204 provides a second voltage at a second node 216.

An output terminal of first multiplexer 208 is connected to a first input terminal of comparator 108. A second input terminal of comparator 108 is connected to reference voltage generator 206 through offset voltage 212. An output terminal of comparator 108 is connected to a first input terminal of second multiplexer 210 and an input terminal of invertor 214. An output terminal of invertor 214 is connected to a second input terminal of second multiplexer 210. An output terminal of second multiplexer 210 is connected to counter 110. An output terminal of counter 110 is connected to both first post driver 202 and second post driver 204.

During the calibration operation, first multiplexer 208 choses one of first post driver 202 and second post driver 204 to be calibrated. In some examples, first multiplexer 208 choses first post driver 202 to be calibrated first and then choses second post driver 204 to be calibrated after the calibration of first post driver 202. During the calibration of first post driver 202 (also referred to as a pull-up calibration) the first voltage at pad 106 becomes the same or nearly the same as the reference voltage. When first post driver 202 is chosen for calibration, the first input terminal of comparator 108 is connected to pad 106. Comparator 108 thus receives the pad voltage (that is, the first voltage) at the first input terminal and the reference voltage offset by the offset voltage Vos at the second input terminal. Comparator 108 then compares the pad voltage with the reference voltage and provides an output signal at the output terminal based on the comparison. Invertor 214 receives the output signal from comparator 108, inverts the output signal, and provides the inverted output signal at the output terminal.

Thus, the first input terminal of second multiplexer 210 receives the output signal as a first input from comparator 108 and the second input terminal of second multiplexer 210 receives the inverted output signal as a second input from invertor 214. Second multiplexer 210 selected one of the two inputs and provides the selected input to counter 110. In some examples, for calibrating first post driver 202, the inverted output signal is selected. Counter 110 generates the PUCODE<0:N> (also referred to as first calibration codes) for first post driver 202 based on the received output signal. The PUCODE <0:N> is provided to first post driver 202 that adjust its resistance to match that of external resistor 112. For examples, the PUCODE<0:N> is used to turn ON or turn OFF one or more transistors in first post driver 202 to calibrate its resistance to match that of external resistor 112. The calibrated resistance of first post driver 202 effects the first voltage of pad 106, and this operation is repeated. As a result, the PUCODE <0:N> is counted until the resistance value of first post driver 202 becomes identical or nearly identical to the resistance value of external resistor 112.

Like the pull-up calibration, a pull-down calibration (that is the calibration of second post driver 204) starts in a manner that the second voltage at second node 216 becomes the same or nearly the same as the reference voltage. In other words, the pull-down calibration is performed such that the resistance value of second post driver 204 becomes the same or nearly the same as that of external resistor 112. For example, after calibration of first post driver 202, first multiplexer 208 selects second post driver 204 for calibration. First multiplexer 208 provides a second voltage of second node 216 at the second input terminal as an output to comparator 108. Comparator 108 compares the second voltage received at the first input terminal with the reference voltage offset by the offset voltage Vos received at the second input terminal. Comparator 108 provides an output signal at the output terminal based on the comparison. Invertor 214 receives the output signal from comparator 108, inverts the output signal and provides the inverted output signal at the output terminal.

Thus, the first input terminal of second multiplexer 210 receives the output signal as a first input from comparator 108 and the second input terminal of second multiplexer 210 receives the inverted output signal as a second input from invertor 214. In some examples, for calibrating second post driver 204, the non-inverted output signal is selected. Second multiplexer 210 selected one of the two inputs and provides the selected input to counter 110. Counter 110 generates the PDCODE<0:N> (also referred to as a second calibration code) for second post driver 204 based on the received output signal. The PDCODE <0:N> is provided to second post driver 204 that adjust its resistance to match that of external resistor 112. For examples, the PDCODE<0:N> is used to turn ON or turn OFF one or more transistors in second post driver 204 to calibrate its resistance to match that of external resistor 112. In some examples, for calibrating second post driver 204, both PDCODE<0:N> and PUCODE<0:N> codes are used. For examples, first portion of second post driver 204 is calibrated using the PUCODE<0:N> and then a second portion of second post driver 204 is calibrated using the PDCODE<0:N>.

Figure 3A:
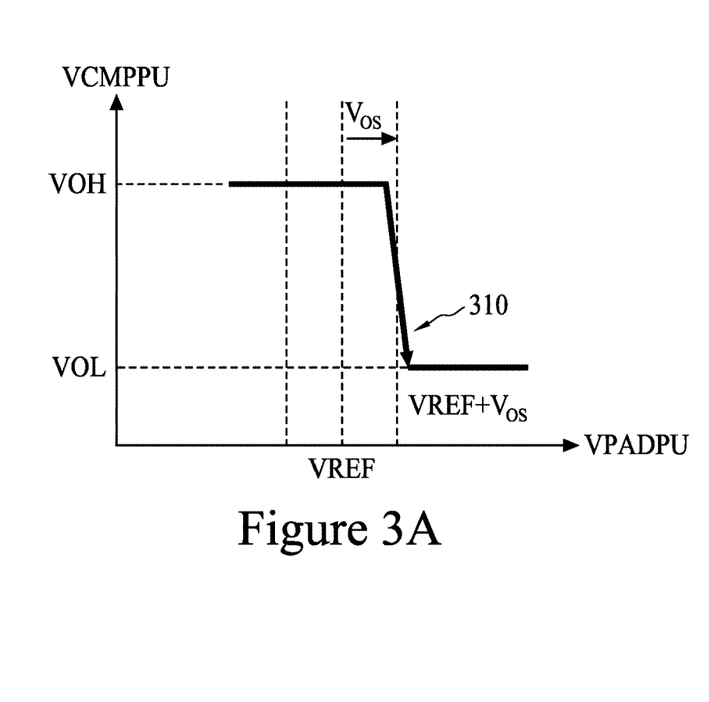
FIG. 3A is a graph illustrating an output voltage of a comparator for a first post driver calibration, in accordance with some embodiments.

FIG. 3A is a graph illustrating the output signal of comparator 108 for first post driver 202 calibration. For examples, first plot 310 of FIG. 3A illustrates the output signal of comparator 108 for first post driver 202 calibration. As shown in FIG. 3A, the output signal is a logic high (shown as VOH) until the first voltage (that is, the pad voltage) is less than the reference voltage plus the offset voltage Vos. When, the first voltage (that is, the pad voltage) is greater than the reference voltage plus the offset voltage Vos, the output signal of comparator 108 drops to a logic low (shown as VOL).

Figure 3B:
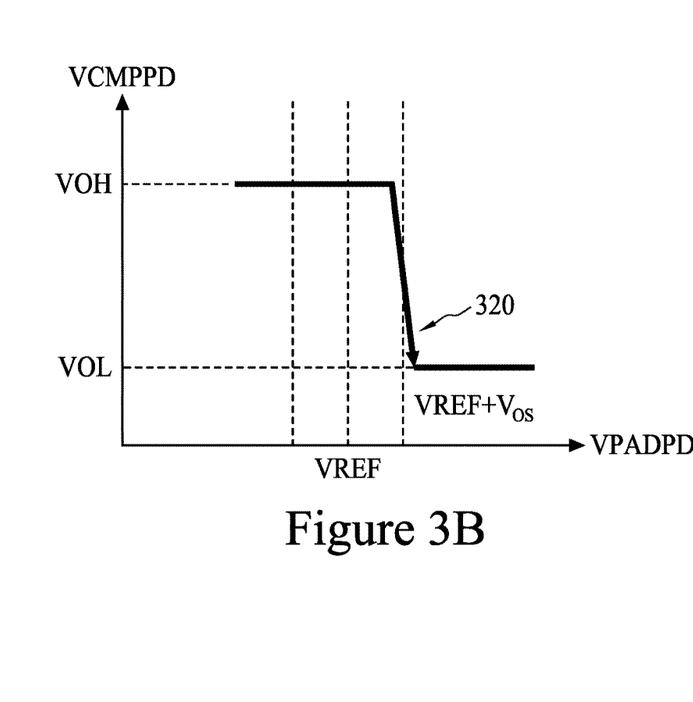
FIG. 3B is a graph illustrating an output voltage of a comparator for a second post driver calibration, in accordance with some embodiments.

FIG. 3B is a graph illustrating the output signal of comparator 108 for second post driver 204 calibration. For examples, second plot 320 of FIG. 3B illustrates the output signal of comparator 108 for second post driver 204 calibration. As shown in FIG. 3B, the output signal is a logic high (shown as VOH) until the second voltage (that is, the pulldown voltage) is less than the reference voltage plus the offset voltage Vos. When, the second voltage is greater than the reference voltage plus the offset voltage Vos, the output signal of comparator 108 drops to a logic low (shown as VOL). Thus, and as shown in FIGS. 3A and 3B, the effect of the offset voltage is predictable and in a same fashion for both first post driver 202 calibration and second post driver 204 calibration. This results in better calibration of both first post driver 202 calibration and second post driver 204 calibration.

Figure 4A:
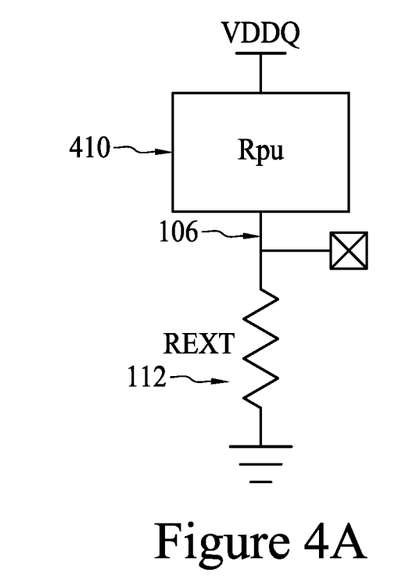
FIG. 4A illustrates an equivalent circuit diagram for a first post driver calibration, in accordance with some embodiments.

FIG. 4A illustrates an equivalent circuit diagram for first post driver 202 calibration. As shown in FIG. 4A, the equivalent circuit diagram for first post driver 202 calibration includes a first post driver resistor Rpu 410 connected in series with external resistor 112. For example, a first terminal of first post driver resistor Rpu 410 is connected to the voltage VDDQ node and a second terminal of first post driver resistor Rpu 410 is connected to pad 106. External resistor 112 is connected between pad 106 and the ground. In examples, a resistance value of external resistor 112 is approximately equal to 50 Ohms and the voltage VDDQ is approximately equal to 300 mV. Hence, the voltage of pad 106, which is one half of the voltage VDDQ offset by the offset voltage Vos is approximately equal to 155 mv (that is, 150 mV+5 mV). Therefore, the resistance value of first post driver resistor Rpu 410 is determined as:

$$\frac{50}{50 + Rpu} \times 300 = 150 + 5$$

Rpu=46.77. The resistance value of first post driver resistor Rpu 410 is therefore offset by 3.23 ohms from that of external resistor 112 which has a resistance value of 50 ohms.

Figure 4B:
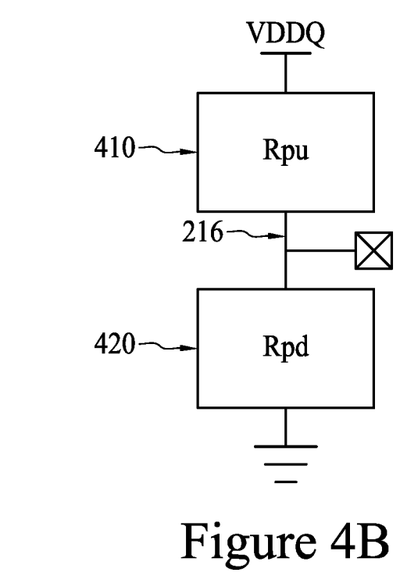
FIG. 4B illustrates an equivalent circuit diagram for a second post driver calibration, in accordance with some embodiments.

FIG. 4B illustrates an equivalent circuit diagram for second post driver 204 calibration. As shown in FIG. 4B, the equivalent circuit diagram for second post driver 204 calibration includes first post driver resistor Rpu 410 connected in series with a second post driver resistor Rpd 420. For example, the first terminal of first post driver resistance Rpu 410 is connected to the voltage VDDQ node and the second terminal of post driver resistance Rpu 410 is connected to second node 216. Therefore, the resistance value of second post driver 204, that is, second post driver resistance Rpd 420 is determined as:

$$\frac{Rpd}{46.77 + Rpd} \times 300 = 150 + 5$$

Rpd=49.99. The resistance value of second post driver resistor Rpd 420 is therefore offset by 0.01 ohms from that of external resistor 112 which has a resistance value of 50 ohms. Hence, the deviation in second post driver resistor Rpd 420 is less than the deviation in first post driver resistor Rpd 410. Thus, the accuracy of the calibration is increased.

Figure 5:
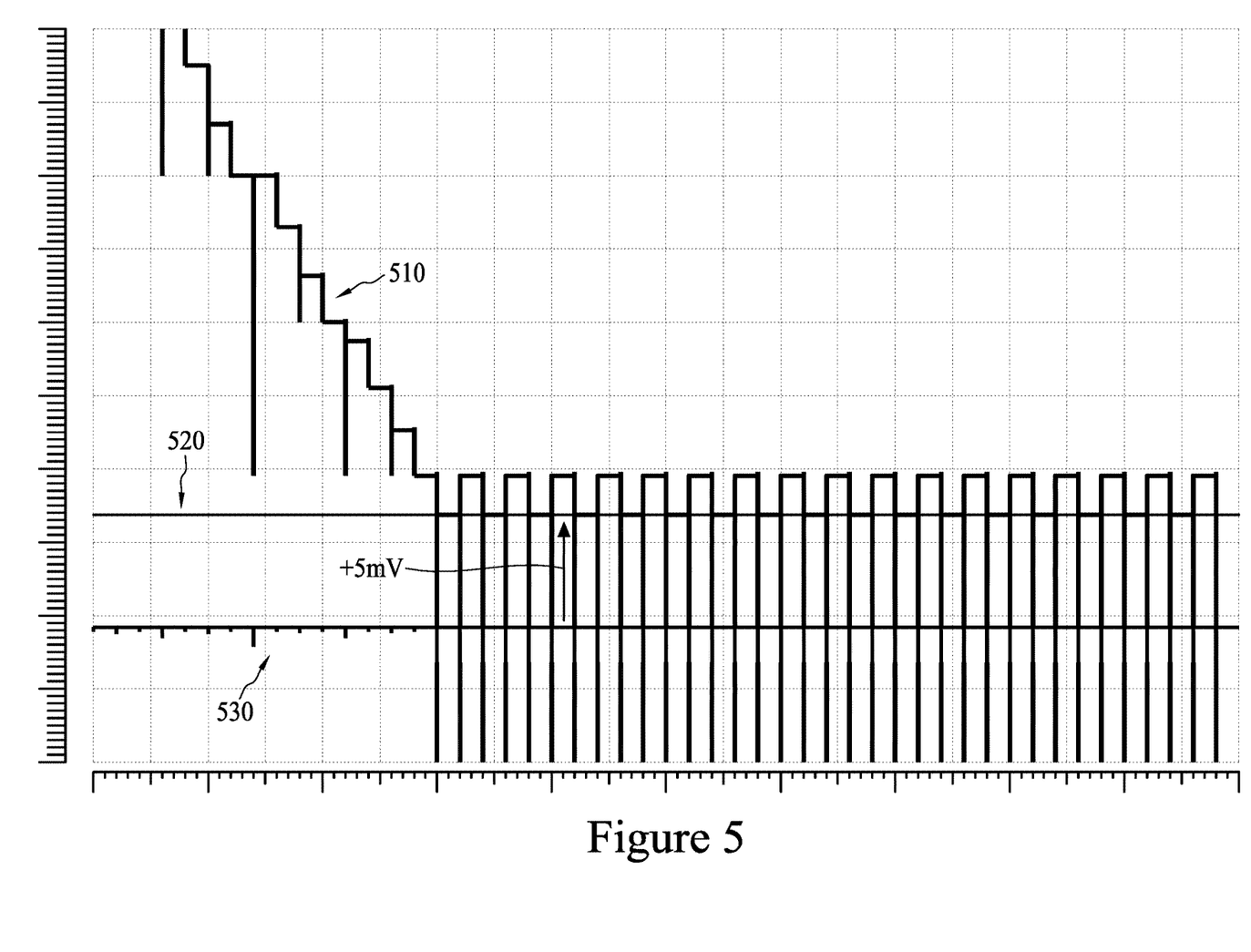
FIG. 5 is a graph illustrating calibration voltages in accordance with some embodiments.

FIG. 5 is a graph illustrating calibration voltages in accordance with some embodiments. For examples, first plot 510 illustrates the first voltage, second plot 520 illustrates second voltage, and third plot 530 illustrates the reference voltage. As shown in FIG. 5, the first voltage converges on the reference voltage.

Figure 6:
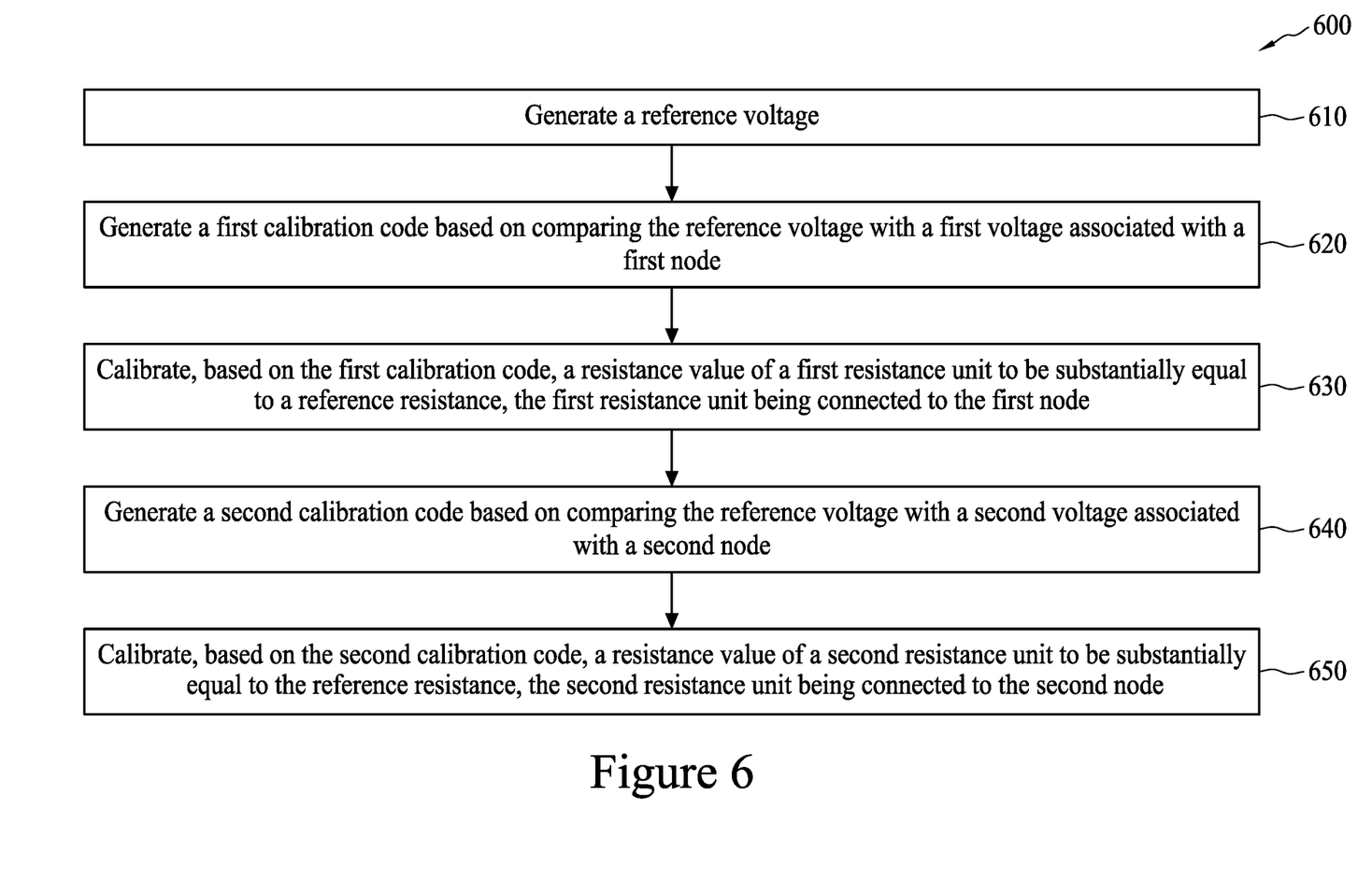
FIG. 6 is a flow diagram illustrating a method of impedance matching, in accordance with some embodiments.

FIG. 6 illustrates a flow diagram of a method 600 for impedance matching, in accordance with some embodiments. In examples, method 600 can be practices in impedance matching circuits described with reference to FIGS. 1-2 above. In some examples, method 600 can be stored as instructions on a storage medium and when executed by a processor connected to the storage medium perform method 600.

At block 610 of method 600, the reference voltage is generated. For examples, reference voltage generator 206 generates the reference voltage. In some examples, the reference voltage is half of the voltage VDDQ.

At block 620 of method 600, a first calibration code is generated based on comparing the reference voltage with a first voltage associated with a first node. For example, comparator 108 compares the first voltage with the reference voltage and generates the output signal based on the comparison. Counter 110 then generates the first calibration code (that is, the PUCODE<0:N>) from the output signal.

At block 630 of method 600, a resistance value of a first resistance unit is calibrated based on the first calibration code to be equal to a reference resistance. The first resistance unit is connected to the first node. For example, the resistance value of first post driver 202 is calibrated based on the first calibration code to be equal to the resistance value of external resistor 112.

At block 640 of method 600, a second calibration code is generated based on comparing the reference voltage with a second voltage associated with a second node. For example, comparator 108 compares the second voltage with the reference voltage and generates the output signal based on the comparison. Counter 110 then generates the second calibration code (that is, the PDCODE<0:N>) from the output signal.

At block 650 of method 600, a resistance value of a second resistance unit is calibrated based on the second calibration code to be equal to the reference resistance. The second resistance unit is connected to the second node. For example, the resistance value of second post driver 204 is calibrated based on the second calibration code to be equal to the resistance value of external resistor 112.

In accordance with example embodiments, an impedance matching circuit comprises: a reference voltage generator configured to generate a reference voltage; a code generator configured to generate a first calibration code by comparing the reference voltage with a first voltage associated with a first node and a second calibration code by comparing the reference voltage with a second voltage associated with a second node; a first resistance unit configured to supply the first voltage to the first node in response to the first calibration code to calibrate its resistance to be substantially equal to a reference resistance; and a second resistance unit configured to supply the second voltage to the second node in response to the second calibration code to calibrate its resistance to the reference resistance.

In example embodiments, an impedance matching circuit comprises: an external resistor connected between a first node and ground; a first resistance unit connected to the first node; a second resistance unit connected between a second node and the ground; a reference voltage generator configured to generate a reference voltage; a code generator configured to generate a first calibration code by comparing the reference voltage with a first voltage associated with the first node and a second calibration code by comparing the reference voltage with a second voltage associated with the second node, wherein: the first resistance unit, in response to the first calibration code, is configured to calibrate its resistance to be substantially equal to a reference resistance; and the second resistance unit, in response to the second calibration code, is configured to calibrate its resistance to be substantially equal to the reference resistance.

In accordance with example embodiments, a method for calibrating an impedance of a device, comprises: generating a reference voltage; generating a first calibration code based on comparing the reference voltage with a first voltage associated with a first node; calibrating, based on the first calibration code a resistance value of a first resistance unit to be substantially equal to a reference resistance, wherein the first resistance unit is connected to the first node; generating a second calibration code based on comparing the reference voltage with a second voltage associated with a second node; and calibrating, based on the second calibration code, a resistance value of a second resistance unit to be substantially equal to the reference resistance, wherein the second resistance unit is connected to the second node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An impedance matching circuit comprising:
a reference voltage generator configured to generate a reference voltage;
a code generator configured to generate a first calibration code by comparing the reference voltage with a first voltage associated with a first node and a second calibration code by comparing the reference voltage with a second voltage associated with a second node, wherein the code generator comprises a first multiplexer and a comparator, wherein the first multiplexer selects one of the first voltage and the second voltage and provides the selected voltage to a first input terminal of the comparator;
a first resistance unit configured to supply the first voltage to the first node in response to the first calibration code to calibrate its resistance to be substantially equal to a reference resistance; and
a second resistance unit configured to supply the second voltage to the second node in response to the second calibration code to calibrate its resistance to the reference resistance.

2. The impedance matching circuit of claim 1, wherein the first multiplexer is configured to select the first voltage to calibrate the first resistance unit, and wherein the comparator is configured to compare the first voltage with the reference voltage received at a second input terminal of the comparator.

3. The impedance matching circuit of claim 2, wherein the code generator further comprises a second multiplexer and an invertor, wherein the comparator is configured to provide an output signal to a first input terminal of the second multiplexer and to an input terminal of the invertor based on comparing the first voltage with the reference voltage.

4. The impedance matching circuit of claim 3, wherein the invertor is configured to invert the output signal received from the second multiplexer and to provide an inverted output signal to a second input terminal of the second multiplexer, wherein the second multiplexer is configured to select one of the output signal received at the first input terminal of the second multiplexer and the inverted output signal received at the second input terminal of the second multiplexer.

5. The impedance matching circuit of claim 4, wherein the code generator further comprises a counter, wherein the counter is configured to receive the selected output signal from the second multiplexer and to generate the first calibration code based on the received selected output signal.

6. The impedance matching circuit of claim 1, wherein the first multiplexer is configured to select the second voltage to calibrate the second resistance unit, and wherein the comparator is configured to compare the second voltage with the reference voltage received at a second input terminal of the comparator.

7. The impedance matching circuit of claim 6, wherein the code generator further comprises a second multiplexer and an invertor, wherein the comparator is configured to provide an output signal to a first input terminal of the second multiplexer and to an input terminal of the invertor based on comparing the second voltage with the reference voltage.

8. The impedance matching circuit of claim 7, wherein the invertor is configured to invert the output signal received from the second multiplexer and to provide an inverted output signal to a second input terminal of the second multiplexer, wherein the second multiplexer is configured to select one of the output signal received at the first input terminal of the second multiplexer and the inverted output signal received at the second input terminal of the second multiplexer.

9. The impedance matching circuit of claim 8, wherein the code generator further comprises a counter, wherein the counter is configured to receive the selected output signal from the second multiplexer and to generate the second calibration codes based on the received selected output signal.

10. An impedance matching circuit comprising:
an external resistor connected between a first node and ground;

a first resistance unit connected to the first node;
a second resistance unit connected between a second node and the ground;
a reference voltage generator configured to generate a reference voltage; and
a code generator configured to generate a first calibration code by comparing the reference voltage with a first voltage associated with the first node and a second calibration code by comparing the reference voltage with a second voltage associated with the second node, wherein:
the first resistance unit, in response to the first calibration code, is configured to calibrate its resistance to be substantially equal to a reference resistance;
the second resistance unit, in response to the second calibration code, is configured to calibrate its resistance to be substantially equal to the reference resistance;
the code generator comprises a first multiplexer and a comparator; and
the first multiplexer selects one of the first voltage and the second voltage and provides the selected voltage to a first input terminal of the comparator.

11. The impedance matching circuit of claim 10, wherein the reference voltage is half of a supply voltage.

12. The impedance matching circuit of claim 10, wherein the reference voltage generator is configured to generate the reference voltage by dividing a supply voltage.

13. The impedance matching circuit of claim 10, wherein the reference voltage generator includes a plurality of resistors connected in series between a supply voltage node and ground.

14. The impedance matching circuit of claim 10, wherein the first resistance unit comprises:
a plurality of resistors connected in parallel between a first internal node and ground; and
a plurality of transistors connected to the plurality of resistors.

15. The impedance matching circuit of claim 14, wherein the plurality of transistors are switched ON or OFF based on the first calibration code to match resistance of first resistance unit to be equal to a reference resistance.

16. The impedance matching circuit of claim 14, wherein the plurality of transistors are switched ON or OFF based on the second calibration code to match resistance of the second resistance unit to be equal to a reference resistance.

17. The impedance matching circuit of claim 10, wherein the second resistance unit comprises:
a plurality of resistors connected in parallel between a second internal node and ground; and
a plurality of transistors connected to the plurality of resistors.

18. A method for calibrating an impedance of a device, the method comprising:
generating a reference voltage;
generating, by a code generator, a first calibration code based on comparing the reference voltage with a first voltage associated with a first node;
calibrating, based on the first calibration code a resistance value of a first resistance unit to be substantially equal to a reference resistance, wherein the first resistance unit is connected to the first node;
generating, by the code generator, a second calibration code based on comparing the reference voltage with a second voltage associated with a second node, wherein the code generator comprises a first multiplexer and a comparator, wherein the first multiplexer selects one of the first voltage and the second voltage and provides the selected voltage to a first input terminal of the comparator; and
calibrating, based on the second calibration code, a resistance value of a second resistance unit to be substantially equal to the reference resistance, wherein the second resistance unit is connected to the second node.

19. The method of claim 18, wherein calibrating based on the first calibration code the resistance value of the first resistance unit to be substantially equal to the reference resistance comprises switching ON or OFF one or more transistors in the first resistance unit based on the first calibration code.

20. The method of claim 18, wherein the first multiplexer is configured to select the first voltage to calibrate the first resistance unit, and wherein the comparator is configured to compare the first voltage with the reference voltage received at a second input terminal of the comparator.

* * * * *